United States Patent [19]

Wood et al.

[11] Patent Number: 5,851,845

[45] Date of Patent: *Dec. 22, 1998

[54] PROCESS FOR PACKAGING A SEMICONDUCTOR DIE USING DICING AND TESTING

[75] Inventors: Alan G. Wood, Boise; Warren M. Farnworth, Nampa, both of Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 574,403

[22] Filed: Dec. 18, 1995

[51] Int. Cl.$^6$ .......................... H01L 21/58; H01L 21/60; H01L 21/70

[52] U.S. Cl. .......................... 438/15; 438/107; 438/108; 438/109; 438/113; 438/114; 438/977

[58] Field of Search .................................... 437/209, 974; 148/DIG. 135, DIG. 150; 438/15, 107, 108, 109, 113, 114, 977

[56] References Cited

U.S. PATENT DOCUMENTS

| | | | |
|---|---|---|---|
| 4,266,334 | 5/1981 | Edwards et al. | 437/974 |
| 4,879,258 | 11/1989 | Fisher | 437/974 |
| 4,883,773 | 11/1989 | Ishikura | 437/207 |
| 4,914,815 | 4/1990 | Takada et al. | 437/226 |
| 4,946,716 | 8/1990 | Corrie | 437/974 |
| 5,162,251 | 11/1992 | Poole et al. | 437/974 |
| 5,202,754 | 4/1993 | Bertin et al. | 257/777 |
| 5,239,198 | 8/1993 | Lin et al. | 257/693 |
| 5,290,710 | 3/1994 | Haj-Ali-Ahmadi et al. | 437/8 |
| 5,336,928 | 8/1994 | Neugebauer, et al. | 257/758 |
| 5,387,551 | 2/1995 | Mizoguchi et al. | 437/209 |
| 5,408,190 | 4/1995 | Wood et al. | 324/765 |
| 5,451,165 | 9/1995 | Cearley-Cabbiness et al. | 257/704 |
| 5,455,455 | 10/1995 | Badehi | 437/227 |
| 5,457,072 | 10/1995 | Tamaki et al. | 437/226 |
| 5,517,754 | 5/1996 | Beilstein, Jr. et al. | 437/209 |
| 5,563,084 | 10/1996 | Ramm et al. | 437/974 |
| 5,646,067 | 7/1997 | Gaul | 437/228 |
| 5,656,553 | 8/1997 | Leas et al. | 438/15 |

OTHER PUBLICATIONS

Wolf et al., Silicon Processing for the VLSI Era vol. 1: Process Technology, Lattice Press, Sunset Beach CA, pp. 531–532, 1986.

Tummala et al., Microelectronics Packaging Handbook, Van Nostrand Reinhold, New York, NY, pp. 1038–1040, 1989.

Primary Examiner—David Graybill
Attorney, Agent, or Firm—Stephen A. Gratton

[57] ABSTRACT

A method for packaging semiconductor dice is provided. The package includes a thinned die mounted on a compliant adhesive layer to a substrate. The package is formed by providing a wafer containing a plurality of dice, thinning a backside of the wafer by etching or polishing, attaching the thinned wafer to the substrate, and then dicing the wafer. The semiconductor package can be mounted to a supporting substrate such as a printed circuit board in a chip-on-board configuration. The compliant adhesive layer and substrate of the package eliminate stresses and cracking of the die caused by a thermal mismatch between the die and supporting substrate. In addition, the semiconductor package can be mounted in a flip chip configuration with the substrate for the package protecting a backside of the die from radiation.

16 Claims, 1 Drawing Sheet

PROCESS FOR PACKAGING A SEMICONDUCTOR DIE USING DICING AND TESTING

FIELD OF THE INVENTION

This invention relates generally to semiconductor manufacture and particularly to an improved method for packaging a semiconductor die.

BACKGROUND OF THE INVENTION

First level packages for semiconductor dice typically include ceramic or plastic packages that encapsulate the dice and provide a substantial lead system. Semiconductor dice are also used in bare or unpackaged form. Unpackaged semiconductor dice are used to construct multi chip modules and other electronic devices. One type of mounting arrangement typical for unpackaged dice is known as chip-on-board (COB). With chip-on-board mounting, dice are bonded directly to a printed circuit board or other supporting substrate. Methods of bonding a chip-on-board die include wirebonding, tape automated bonding (TAB) and solder interconnections.

With wirebonding the die is back bonded to the circuit board and bond wires are attached to the bondpads on the face of the die and corresponding connection points on the circuit board. Bonding of the die to the circuit board can be accomplished using an adhesive such as an epoxy or eutectic alloy (e.g., gold-silicon). In high power applications, high-thermal conductivity adhesives are required to conduct heat away from the die. To achieve a high thermal conductivity, metals such as silver are sometimes placed into the adhesive.

One problem that occurs with chip-on-board mounting of an unpackaged die on a circuit board is that thermal stresses can develop between the die and circuit board. These thermal stresses can be caused by a mismatch in the coefficients of thermal expansion (CTE) for the die and circuit board. Semiconductor dice are typically formed of silicon, whereas circuit boards are typically formed of glass filled materials such as epoxy-glass laminates (e.g., FR-4). The thermal stresses can create problems such as cracking of the die or circuit board, or loosening of the adhesive bond between the die and circuit board.

One proposed solution to the problem of thermal stress is matching the thermal expansion of the circuit board to that of a silicon die. For example, circuit boards have been formed of organic materials such as polyimide-Kevlar™ having a CTE that closely matches that of silicon. In general, these types of board materials have not received widespread acceptance in the industry. First level semiconductor packages have also been developed using materials such as glass-ceramics having a CTE that matches that of a circuit board. However, these types of packages are relatively expensive and complicated.

Another problem that can sometimes occur with semiconductor dice is that of soft errors resulting from radiation. This radiation can originate in radioactive materials such as uranium and thorium present as trace impurities in electronic components or from background radiation as in a space application. For some military and scientific applications, semiconductor dice must be constructed to withstand radiation bombardment. Standards have thus been developed for radiation hardened semiconductors. However, with a standard monolithic die there is typically no protection from radiation bombardment.

Because of these problems, it would be advantageous to be able to package semiconductor dice in a configuration that allows a die to be chip-on-board mounted to a conventional circuit board without thermal stress. In addition, it would be advantageous to provide a semiconductor die that is radiation hardened but without the expense and complexity associated with a conventional radiation hardened die.

In view of the foregoing, it is an object of the present invention to provide an improved method for packaging semiconductor dice and an improved semiconductor package.

It is yet another object of the present invention to provide an improved method for packaging semiconductor dice that allows dice to be chip-on-board mounted to a supporting substrate without thermal stress developing between the die and substrate.

It is a further object of the present invention to provide an improved method for packaging dice that is simpler and cheaper than a conventional packaging process for dice but which eliminates thermal stress and provides radiation protection for the dice.

Other objects, advantages and capabilities of the present invention will become more apparent as the description proceeds.

SUMMARY OF THE INVENTION

In accordance with the present invention, an improved method for packaging semiconductor dice and an improved semiconductor package are provided. The improved package includes a thinned integrated circuit die mounted to a substrate on a compliant adhesive layer. The substrate for the package can be formed of silicon, ceramic, or a glass filled epoxy such as an FR-4 material used to construct printed circuit boards. The compliant adhesive layer can be formed of a polyimide, epoxy, silicone elastomer, thermoplastic glue or acrylic resin.

The packaged die can be chip-on-board mounted to a supporting substrate such as a printed circuit board. In the chip-on-board configuration thermal stresses between the thinned die and the supporting substrate are absorbed by the compliant layer. The packaged die can also be flip chip mounted to the supporting substrate.

The semiconductor devices formed on the thinned die are radiation protected by the structure of the package. Specifically, the compliant adhesive layer can be formed of a radiation hardened material to provide a radiation protection layer in close proximity to the semiconductor devices. In addition, because the devices are contained on a thinned semiconducting substrate, the bulk of the package is formed by the substrate for the package. This bulk of material is separated from the semiconductor devices by the radiation hardened compliant adhesive layer. Furthermore, the particle or radiation ionizing path through the thinned semiconducting substrate is minimized by the thinness of the die.

A method for forming the package includes the steps of: providing a wafer having a plurality of integrated circuit dice; thinning the wafer by etching or polishing a backside thereof; attaching the thinned wafer to a substrate with a compliant adhesive layer therebetween; and then dicing the wafer and substrate to form a plurality of dice.

DETAILED DESCRIPTION OF THE PREFERRED EMBODIMENT

Figure 1:
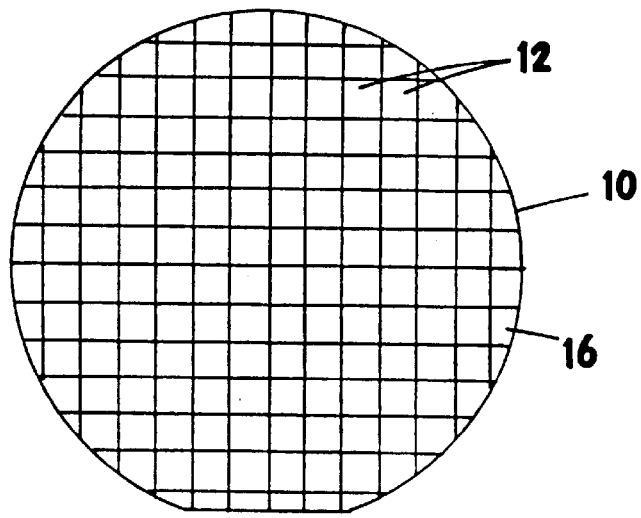
FIG. 1 is a plan view of a semiconductor wafer formed with a plurality of integrated circuit dice.
Figure 2:
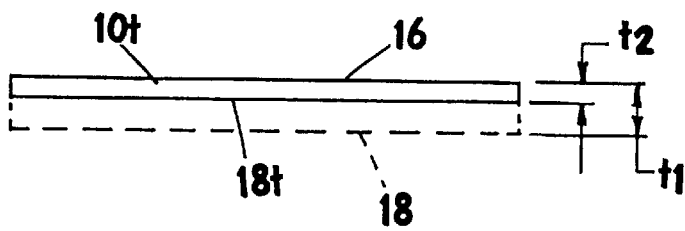
FIG. 2 is a side elevation view of the wafer after thinning in accordance with the invention.

In FIGS. 1 and 2, initial steps in the formation of a packaged die in accordance with the invention are illustrated. Initially a wafer 10 comprising a semiconducting substrate (e.g., monocrystalline silicon) is provided. The wafer 10 includes a plurality of semiconductor dice 12 that have been formed with semiconductor devices using techniques that are well known in the art. For example, each die 12 can include rows and columns of semiconductor devices such as FETs and capacitors for a dynamic random access memory (DRAM). The wafer 10 includes a face 16 superjacent to the semiconductor devices and a backside 18 (FIG. 2).

As shown in FIG. 2, the wafer 10 has an initial thickness of $t_1$ measured from the backside 18 to the face 16 of the wafer 10. In accordance with the invention, the wafer 10 is thinned to form a thinned wafer 10t. The thinned wafer 10t thus includes conventional semiconductor devices formed on a thinned semiconducting substrate. The thinned wafer 10t has a thickness of $t_2$ measured from a thinned backside 18t to the face 16 (where $t_2<t_1$). The thinned wafer 10t can be formed by etching, chemical mechanical polishing (CMP) or back polishing. By way of example and not limitation, the wafer 10 (FIG. 1) can initially have a thickness $t_1$ of from about 25–35 mils (1 mil=0.001 inches). The thinned wafer 10t can have a thickness $t_2$ of between about 1–14 mils (25.4 $\mu$m –355.6 $\mu$m).

Either a wet or dry etching process can be used to etch the backside 18 of the wafer 10 (FIG. 1) to form the thinned wafer 10t. For thinning by wet etching, an etchant solution containing a mixture of KOH (Potassium Hydroxide) and $H_2O$ can be utilized. A one to one solution at a temperature of about 60° to 80° C. will etch monocrystalline silicon at an etch rate of about 300 to 800 Å/min. Another wet etching process can be performed using an isotropic etch of $HNO_3$ and HF producing an etch rate of 55–60 $\mu$m/min. A dry etch process with an etchant such as a species of chlorine can also be utilized. In this case, the etch rate will be much slower than specified above.

Alternately, thinning can be performed using chemical mechanical polishing (CMP). One suitable CMP apparatus is manufactured by Westech Engineering and is designated a Model 372 Polisher. Representative process conditions include a Rodel Polytex Supreme pad, a silica based slurry composition, a pressure of from 1 psi to 5 psi and RPMs of from 5 to 50. A polisher as identified above can also be used to simply back polish or back grind the wafer 10 without chemical etching.

Figure 3:
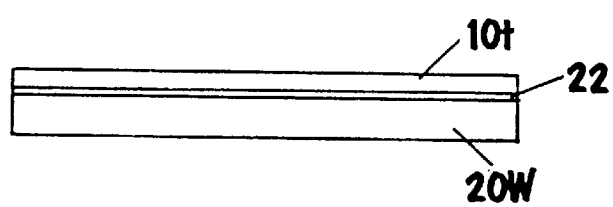
FIG. 3 is a schematic side elevation view of the thinned wafer attached to a wafer substrate with a compliant adhesive layer therebetween.

After the thinned wafer 10t has been formed and as shown in FIG. 3, a substrate wafer 20W is attached to the thinned wafer 10t. The substrate wafer 20W can be formed of silicon, ceramic or a circuit board material such as an epoxy resin-glass cloth laminate (e.g., FR-4). The substrate wafer 20W can also be formed of a metal, a carbide or a glass. The substrate wafer 20W can be formed with a thickness of from about 10 mils to 30 mils.

The thinned wafer 10t is attached to the substrate wafer 20W by forming a compliant adhesive layer 22 therebetween. In general, the compliant adhesive layer 22 is formed of a material that is compliant enough to absorb thermally developed mechanical stresses. The compliant adhesive layer 22 can be formed of an adhesive such as a polyimide, epoxy, silicone elastomer, thermoplastic glue or acrylic resin. One suitable adhesive is Zymet™ silicone elastomer manufactured by Zymet, Inc., East Hanover, N.J.

The compliant adhesive layer 22 is preferably made as thin as possible. A representative thickness for the compliant adhesive layer 22 is about 0.5 $\mu$m to 25 $\mu$m. A compressive load, such as a weighted jig, can be placed on the thinned wafer 10t or substrate wafer 20W during curing of the compliant adhesive layer 22 to compress and evenly distribute the adhesive material.

Figure 3A:
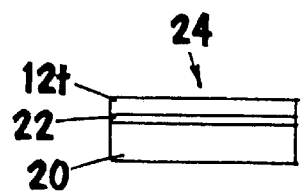
FIG. 3A is a schematic side elevation view of a package formed in accordance with the invention by dicing the wafer and wafer substrate.

Following attachment of the substrate wafer 20W to the thinned wafer 10t, and as shown in FIG. 3A, the thinned wafer 10t is diced to form a plurality of semiconductor packages 24. The thinned wafer 10t can be diced by saw cutting with a diamond tipped saw or other suitable process such as shearing. Each package 24 includes a thinned semiconductor die 12t having semiconductor devices formed on a thinned semiconducting substrate (e.g., silicon). In addition each package includes a substrate 20 and a compliant adhesive layer 22. The peripheral shape of the die 12t and substrate 20 are exactly the same.

Figure 4:
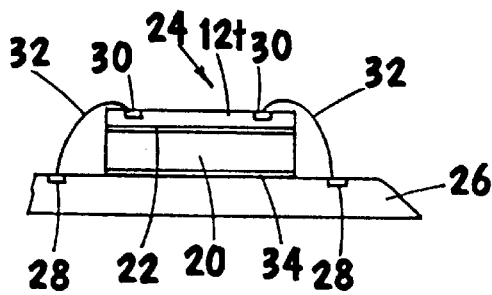
FIG. 4 is a schematic side elevation view of a package constructed in accordance with the invention and wire bonded in a chip-on-board configuration to a supporting substrate.

Referring now to FIG. 4, a package 24 is shown wire bonded to a supporting substrate 26 in a chip-on-board configuration. By way of example, the supporting substrate 26 can be a printed circuit board formed of a material such as a glass filled epoxy. Depending on the application, the supporting substrate 26 can also be formed of silicon, ceramics and other materials used in the construction of multi-chip-modules, in-line memory modules and other electronic devices. The substrate 20 for the package 24 is attached to the supporting substrate 26 using an adhesive layer 34. The adhesive layer 34 can be a high thermal conductivity material such as a eutectic alloy or a silver filled epoxy.

The supporting substrate 26 includes contact locations 28 in electrical communication with other electronic devices mounted to the supporting substrate 26 as required. The contact locations 28 are wire bonded to bond pads 30 on the thinned die 12t using bond wires 32. In this chip-on-board configuration mechanical stresses due to a CTE mismatch do not develop between the die 12t and supporting substrate 26 because of the interface provided by the compliant adhesive layer 22. Most of the mechanical stresses will be absorbed by the compliant adhesive layer 22. Accordingly, cracking of the die 12t and supporting substrate 26 due to thermal stress is substantially eliminated.

Figure 5:
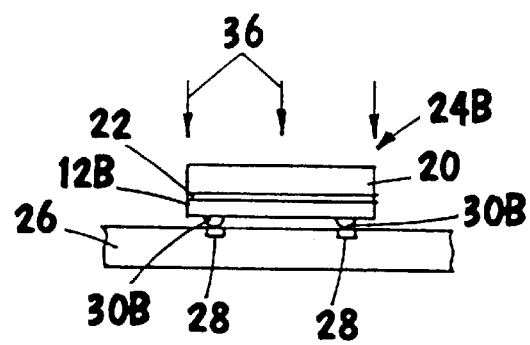
FIG. 5 is a schematic side elevation view of a package constructed in accordance with the invention and flip chip mounted in a chip on board configuration to a supporting substrate.

Referring now to FIG. 5, a package 24B constructed in accordance with the invention is shown flip chip mounted in a chip-in-board configuration. The package 24B is constructed substantially as previously described but includes a thinned die 12B having bumped bond pads 30B. The bumped bond pads 30B are bonded to the contact locations 28 on the supporting substrate 26 such as by reflow soldering.

With flip chip mounting, the backside of the die 12B is protected from radiation bombardment 36 by the compliant adhesive layer 22. In addition, the thinness of the die 12B helps to eliminate soft errors occurring from radiation bombardment. In particular the particle or radiation ionizing path in the semiconducting substrate for the thinned die 12B is reduced by the thinness of the semiconducting material so that hot electron effects are minimized.

Another advantage of a package 24 (or 24B) formed in accordance with the invention, is that testing of the thinned die 12t (or 12B) is facilitated by the support and protection provided by the substrate 20. Preferably, testing is accomplished prior to mounting of the die 12t (or 12B) on the substrate 26. For testing the die 12t (or 12B), a testing apparatus as disclosed in U.S. Pat. No. 5,408,190, incorporated herein by reference, can be used.

This type of testing apparatus is connectable to external test circuitry adapted to generate test signals for testing the operability of the integrated circuits and semiconductor devices formed on a die. With such a testing apparatus, a die is flip chip aligned to an interconnect component of the testing apparatus and then biased against the interconnect. A lid and a spring press against the backside of the die to bias the die and interconnect together. With a package 24 (or 24B) formed as presently described, a lid is not required for testing because the spring component of the test apparatus can press against the substrate 20 for the package 24 without damaging the die 12t.

While the invention has been described with reference to certain preferred embodiments, as will be apparent to those skilled in the art, certain changes and modifications can be made without departing from the scope of the invention at defined by the following claims.

What is claimed is:

1. A semiconductor packaging method comprising:
   providing a first substrate comprising a plurality of integrated circuit dice;
   thinning the first substrate using chemical mechanical polishing;
   providing a second substrate;
   following thinning, attaching the first substrate to the second substrate by forming an adhesive layer between a backside of the first substrate and the second substrate;
   dicing the first substrate and the second substrate to form a package comprising a die, a portion of the adhesive layer and a portion of the second substrate;
   providing a testing apparatus configured to electrically connect the package to test circuitry; and
   testing the package by placing the package in the testing apparatus and applying test signals through the testing apparatus to integrated circuits on the die.

2. The method of claim 1 wherein following thinning the first substrate has a thickness between about 1–14 mils.

3. The method of claim 1 wherein the adhesive layer comprises a material selected from the group consisting of polyimide, epoxy, silicone, thermoplastic glue and acrylic resin.

4. A semiconductor packaging method, comprising:
   providing a semiconductor wafer comprising a plurality of integrated circuit dice;
   providing a substrate wafer;
   thinning the semiconductor wafer by etching a backside thereof to a thickness of between about 1–14 mils;
   following thinning, mounting the semiconductor wafer to the substrate wafer by forming an adhesive layer between a backside of the semiconductor wafer and the substrate wafer;
   following mounting, dicing the semiconductor wafer and the substrate wafer to form a package comprising an integrated circuit die attached to a portion of the substrate wafer with a portion of the adhesive layer therebetween;
   providing a testing apparatus configured to electrically connect the package to test circuitry; and
   testing the package by placing the package in the testing apparatus and applying test signals through the testing apparatus to integrated circuits on the die.

5. The method of claim 4 wherein etching the semiconductor wafer comprises wet etching.

6. The method of claim 4 wherein the adhesive layer comprises a material selected from the group consisting of polyimides, epoxies, silicone elastomers, thermoplastic glues and acrylic resins.

7. The method of claim 4 wherein the testing apparatus comprises an interconnect in electrical communication with the test circuitry and a spring configured to press against the portion of the substrate to bias the package against the interconnect.

8. A semiconductor packaging method comprising:
   providing a wafer comprising a first substrate with a plurality of integrated circuit dice formed thereon;
   thinning the first substrate to a thickness of from about 1–14 mils using chemical mechanical polishing;
   attaching a backside of the first substrate to a second substrate by depositing an adhesive between the first substrate and the second substrate;
   dicing the first substrate and the second substrate to form a plurality of separate packages, each package comprising a die, an adhesive layer and a portion of the second substrate;
   providing a testing apparatus configured to electrically connect a package to test circuitry;
   testing the package by applying test signals through the testing apparatus to the package; and
   following testing mounting the package to a third substrate in a chip on board configuration.

9. The method of claim 8 wherein the chip on board configuration comprises wire bonding.

10. The method of claim 8 wherein the chip on board configuration comprises flip chip bonding.

11. The method of claim 8 wherein the adhesive comprises a material selected from the group consisting of silicone elastomer and polyimide.

12. A semiconductor packaging method comprising:
   providing a semiconductor wafer;
   thinning the semiconductor wafer by chemically mechanically polishing a backside thereof to form a thinned semiconductor wafer having a thickness between about 1–14 mils;
   providing a substrate wafer;
   attaching the thinned semiconductor wafer to the substrate wafer by depositing an adhesive therebetween;
   dicing the thinned semiconductor wafer and the substrate wafer to form a semiconductor package comprising a die, a substrate and an adhesive layer;
   providing a testing apparatus configured to electrically connect the package to test circuitry;
   testing the package by placing the package in the testing apparatus and applying test signals through the testing apparatus to integrated circuits on the die; and following testing, flip chip mounting the package to a supporting substrate.

13. The method of claim 12 wherein the testing apparatus comprises an interconnect in electrical communication with the test circuitry and a spring configured to press against the substrate to bias the package against the interconnect.

14. A semiconductor packaging method comprising:

providing a semiconductor wafer comprising a plurality of integrated circuit dice;

thinning the semiconductor wafer by etching a backside thereof to form a thinned semiconductor wafer having a thickness between about 1–14 mils;

providing a substrate wafer;

attaching the thinned semiconductor wafer to the substrate wafer by forming an adhesive layer therebetween;

dicing the thinned semiconductor wafer and the substrate wafer to form a semiconductor package comprising an integrated circuit die and a substrate;

providing a testing apparatus configured to electrically connect the package to test circuitry;

placing the package in the testing apparatus and testing the package by applying test signals through the testing apparatus to integrated circuits on the die; and following testing, mounting the package to a supporting substrate in a chip on board configuration.

15. The method of claim 14 wherein the substrate wafer comprises FR-4.

16. The method as claimed in claim 15 wherein the substrate wafer comprises silicon.

* * * * *